United States Patent
Nakamura

(10) Patent No.: US 7,612,458 B2
(45) Date of Patent: Nov. 3, 2009

(54) EPOXY RESIN COMPOSITION FOR SEMICONDUCTOR ENCAPSULATING USE, AND SEMICONDUCTOR DEVICE

(75) Inventor: Atsushi Nakamura, Tochigi (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 468 days.

(21) Appl. No.: 11/331,425

(22) Filed: Jan. 12, 2006

(65) Prior Publication Data

US 2006/0228561 A1 Oct. 12, 2006

(30) Foreign Application Priority Data

Jan. 13, 2005 (JP) ............... 2005-005863
Mar. 9, 2005 (JP) ............... 2005-066379
Mar. 29, 2005 (JP) ............... 2005-096569

(51) Int. Cl.
*H01L 23/29* (2006.01)
*B32B 27/04* (2006.01)
*B32B 27/20* (2006.01)
*B32B 27/38* (2006.01)
*C08L 63/00* (2006.01)
*C08K 3/34* (2006.01)

(52) U.S. Cl. ............ 257/789; 257/787; 257/788; 257/793; 257/795; 428/413; 523/457; 523/466

(58) Field of Classification Search ......... 257/787, 257/788, 789, 793, 795; 428/413; 523/457, 523/466
See application file for complete search history.

(56) References Cited

U.S. PATENT DOCUMENTS 6,005,030 A * 12/1999 Togawa et al. ............ 523/443
6,139,978 A * 10/2000 Arai et al. ............... 428/620

FOREIGN PATENT DOCUMENTS

JP 64-065116 3/1989
JP 08-020673 1/1996

* cited by examiner

*Primary Examiner*—Michael J Feely
(74) *Attorney, Agent, or Firm*—Smith, Gambrell & Russell

(57) ABSTRACT

There is provided an epoxy resin composition for semiconductor encapsulating use comprising: an epoxy resin (A); a phenol resin (B); a curing accelerator (C); and an inorganic filler (D), wherein the inorganic filler (D) contains a spherical fused silica (d1) which contains: metal or semimetal other than silicon; and/or an inorganic compound comprising the metal or semimetal other than silicon.

4 Claims, No Drawings

EPOXY RESIN COMPOSITION FOR SEMICONDUCTOR ENCAPSULATING USE, AND SEMICONDUCTOR DEVICE

BACKGROUND OF THE INVENTION

1. Field of the Invention

The present invention relates to an epoxy resin composition for semiconductor encapsulating use, and a semiconductor device encapsulated with the resin. In particular, the present invention relates to the epoxy resin composition for semiconductor encapsulating use, excellent in the flowability, curability, moldability, and solder reflow resistance.

2. Description of the Related Art

Recent trends seeking a highly sophisticated electronic device while seeking the lighter, thinner, shorter and smaller electronic device promote higher integration technology and surface mounting technology of semiconductor devices. With the developments of such a technology, a requirement for epoxy resin composition for semiconductor encapsulating use becomes severer from day to day. Particularly, in low profiled type semiconductor devices, a stress arises due to an insufficient release of a cured epoxy resin composition from a mold for an encapsulating process. This stress may cause a crack in semiconductor elements in the semiconductor devices, or may lowered adhesion between the cured epoxy resin composition and the semiconductor elements at their interfaces. Furthermore, in surface mounted type semiconductor devices, lead-free solders become dominant instead of lead-containing solders, in view of ecological requirements. These lead-free solders require higher temperature for soldering. At such a higher temperature, a great stress is explosively arisen due to the vaporescence of the moisture contained in the semiconductor device. The solder reflow resistance capable of resisting such a great stress becomes a more serious concern than ever. Additionally, there is a need also for lead-free lead frames. From this viewpoint, in semiconductor devices, external plating with lead-containing solder is being replaced by a method using a pre-plating frame obtained by nickel plating, or gold plating on nickel/palladium alloy. The plating of pre-plating frame has remarkably low adhesion with the cured epoxy resin composition. Thereby, separation may be caused at the interface between the pre-plating frame and the cured epoxy resin composition, during the surface mounting. Therefore, there is a need for improving the solder reflow resistance.

In order to prevent the reliability from being lowered because of the soldering, or because of the semiconductor device using the pre-plating frame, there is proposed a technique which improves solder reflow resistance by making an epoxy resin composition with low hygroscopicity, high strength and low thermal expansion property by increasing an amount of an inorganic filler in the resin composition, and which maintains high flowability of the resin composition at a low viscosity during molding by using the epoxy resin composition having low melt viscosity (e.g. Japanese Patent Application Laid-Open No. Shou 64-65116, pages 2 to 7). By this technique, although the solder reflow resistance (may also be called "crack resistance") is improved, the flowability is sacrificed by increasing an amount (content ratio) of the organic filler, so that voids are apt to be generated in the package. In view of this, there is proposed a technique which attempts to maintain the flowability by using a filler having various average particle sizes (e.g. Japanese Patent Application Laid-Open No. Hei 8-20673, pages 2 to 6). However, this method cannot provide an epoxy resin composition for semiconductor encapsulating use which has a good valance of the flowability and the solder reflow resistance.

SUMMARY OF THE INVENTION

The present invention has been accomplished in view of the above problems for example. It is therefore an object of the present invention to provide an epoxy resin composition for semiconductor encapsulating use having an excellent flowability and an excellent moldability, and provide a semiconductor device having an excellent solder reflow resistance.

The above object is solved by an epoxy resin composition for semiconductor encapsulating use comprising: an epoxy resin (A); a phenol resin (B); a curing accelerator (C); and an inorganic filler (D), wherein the inorganic filler (D) contains a spherical fused silica (d1) obtained by fusing silica which contains: metal or semimetal other than silicon; and/or an inorganic compound comprising the metal or semimetal other than silicon.

In the present invention, the metal or semimetal other than silicon; and/or an inorganic compound comprising the metal or semimetal other than silicon are contained in the spherical fused silica, so that a chemical structure or nature of the spherical fused silica is changed. Thereby, it is possible to provide an epoxy resin composition for semiconductor encapsulating use having an excellent flowability and an excellent solder reflow resistance.

First Embodiment

In the first embodiment of the present invention, the epoxy resin composition for semiconductor encapsulating use are characterized in that an extract of the spherical fused silica (d1) has a pH value no less than 3 and no more than 5.

In the epoxy resin composition for semiconductor encapsulating use according to the first embodiment, preferably, a metal ion or a semimetal ion in the metal or semimetal other than silicon and/or the inorganic compound comprising the metal or semimetal other than silicon has an ion charge number no more than 3.

Also in the epoxy resin composition for semiconductor encapsulating use according to the first embodiment, preferably, the spherical fused silica (d1) contains the inorganic compound having the metal or semimetal other than silicon.

Also in the epoxy resin composition for semiconductor encapsulating use according to the first embodiment, preferably, the inorganic compound having the metal or semimetal other than silicon is an inorganic metal oxide comprising an oxide of metal or semimetal other than silicon.

Also in the epoxy resin composition for semiconductor encapsulating use according to the first embodiment, preferably, a content ratio of the spherical fused silica (d1) is not less than 40 weight percent and not more than 94 weight percent relative to the epoxy resin composition as a whole.

Also in the epoxy resin composition for semiconductor encapsulating use according to the first embodiment, preferably, a content ratio of the inorganic filler (D) is not less than 78 weight percent and not more than 94 weight percent.

The above object is achieved also by a semiconductor device comprising a semiconductor element encapsulated with the epoxy resin composition for semiconductor encapsulating use according to the first embodiment.

Second Embodiment

In the second embodiment of the present invention, the epoxy resin composition for semiconductor encapsulating use is characterized in that the inorganic compound comprising the metal or semimetal other than silicon is titanium oxide, and the spherical fused silica (d1) is a eutectic mixture (d2) of silicon dioxide and titanium oxide.

In the epoxy resin composition for semiconductor encapsulating use according to the second embodiment, preferably, a content ratio of the silicon dioxide in the eutectic mixture (d2) of silicon dioxide and titanium oxide is not less than 20 weight percent and not more than 99.8 weight percent, and a content ratio of the titanium oxide in the eutectic mixture (d2) of silicon dioxide and titanium oxide is not less than 0.2 weight percent and not more than 80 weight percent.

Also in the epoxy resin composition for semiconductor encapsulating use according to the second embodiment, preferably, a content ratio of the eutectic mixture (d2) is not less than 8 weight percent and not more than 93 weight percent relative to the epoxy resin composition as a whole.

Also in the epoxy resin composition for semiconductor encapsulating use according to the second embodiment, preferably, a content ratio of the inorganic filler (D) containing the eutectic mixture (d2) is not less than 78 weight percent and not more than 93 weight percent relative to the epoxy resin composition as a whole.

The above object is achieved also by a semiconductor device comprising a semiconductor element encapsulated with the epoxy resin composition for semiconductor encapsulating use according to the second embodiment.

Third Embodiment

In the third embodiment of the present invention, the epoxy resin composition for semiconductor encapsulating use is characterized in that the inorganic compound comprising the metal or semimetal other than silicon is alumina, and the spherical fused silica (d1) is a eutectic mixture (d3) of silicon dioxide and alumina, wherein a content ratio of the silicon dioxide in the eutectic mixture (d3) is not less than 80 weight percent and not more than 99.8 weight percent, and a content ratio of the alumina in the eutectic mixture (d3) is not less than 0.2 weight percent and not more than 20 weight percent.

In the epoxy resin composition for semiconductor encapsulating use according to the third embodiment, preferably, a content ratio of the eutectic mixture (d3) is not less than 8 weight percent and not more than 93 weight percent relative to the epoxy resin composition as a whole.

Also in the epoxy resin composition for semiconductor encapsulating use according to the third embodiment, preferably, a content ratio of the inorganic filler (D) containing the eutectic mixture (d3) is not less than 78 weight percent and not more than 93 weight percent relative to the epoxy resin composition as a whole.

The above object is achieved also by a semiconductor device comprising a semiconductor element encapsulated with the epoxy resin composition for semiconductor encapsulating use according to the third embodiment.

Effect of the Invention

According to the present invention, there is provided an epoxy resin composition for semiconductor encapsulating use having an excellent flowability and an excellent moldability, as well as a semiconductor device having an excellent solder reflow resistance.

The nature, utility, and further features of this invention will be more clearly apparent from the following detailed description with reference to preferred embodiments of the invention.

DETAILED DESCRIPTION OF THE PREFERRED EMBODIMENTS

Now, the present invention is explained in detail.

The present invention provides an epoxy resin composition for semiconductor encapsulating use having an excellent flowability and an excellent moldability, as well as a semiconductor device having an excellent solder reflow resistance, by an epoxy resin composition for semiconductor encapsulating use comprising: an epoxy resin (A); a phenol resin (B); a curing accelerator (C); and an inorganic filler (D), wherein the inorganic filler (D) contains a spherical fused silica (d1) obtained by fusing silica which contains: metal or semimetal other than silicon; and/or an inorganic compound comprising the metal or semimetal other than silicon.

The epoxy resin (A) to be used for the present invention means monomers, oligomers and polymers in general having 2 or more epoxy groups in one molecule. These monomers, oligomers and polymers are not limited to any special molecular weight or molecular structure, but may be biphenyl type epoxy resins, bisphenol type epoxy resins, stilbene type epoxy resins, phenol novolac type epoxy resins, cresol novolac type epoxy resins, triphenol methane type epoxy resins, alkyl modified triphenol methane type epoxy resins, triazine nucleus-containing epoxy resins, dicyclopentadiene modified phenol type epoxy resins, phenol aralkyl type epoxy resins (having a phenol skeleton, biphenylene skeleton and the like) and so on. These resins may be used solely, or may be used as a mixture or blend.

The phenol resin (B) to be used for the present invention means monomers, oligomers and polymers in general having 2 or more phenolic hydroxy groups in one molecule. These monomers, oligomers and polymers are not limited to any special molecular weight or molecular structure, but may be phenol novolac resins, cresol novolac resins, dicyclopentadiene modified phenol resins, terpene modified phenol resins, triphenol methane type resins, phenol aralkyl resins (having a phenylene skeleton, biphenylene skeleton and the like) and so on. These resins may be used solely, or may be used as a mixture or blend.

With regard to content ratios of epoxy resins and phenol resins, a ratio of the number of epoxy groups in the entire epoxy resins relative to the number of phenolic hydroxy groups in the entire phenol resins is preferably not less than 0.7 and not more than 1.3. Within this range, it is possible to prevent curability of the epoxy resin composition from being lowered, prevent a glass transition temperature of a cured epoxy resin composition from being lowered, prevent a water resistant reliability from being lowered, and prevent a solder reflow resistance from being lowered.

The curing accelerator (C) to be used for the present invention is not limited to any special accelerator insofar as promoting a reaction between the epoxy group and the phenolic hydroxy group, but may be; diazabicycloalkenes and derivatives thereof such as 1,8-diazabicyclo(5,4,0)undecene-7; amine-based compounds such as tributyl amine or benzyldimethyl amine; imidazole compounds such as 2-methyl imidazole; organic phosphines such as triphenyl phosphine or methyldiphenyl phosphine; tetra substituted phosphonium-tetra substituted borate such as tetraphenyl phosphonium-tetraphenyl borate, tetraphenyl phosphonium-tetra benzoic acid borate, tetra phenyl phosphonium-tetra naphthoic acid borate, tetra phenyl phosphonium-tetra naphthoyl oxy borate, or tetra phenyl phosphonium-tetra naphtyl oxy borate; and so on. These compounds may be used solely, or may be used as a mixture or blend.

Also an adduct of a phosphine compound and a quinone compound may be used as the curing accelerator (C) to be used for the present invention As the phosphine compound, it is possible to use triphenyl phosphine, tri-p-triphenyl phosphine, diphenyl cyclohexyl phosphine, tricyclohexyl phosphine, tributyl phosphine and so on. As the quinone compound, it is possible to use 1,4-benzoquinone, methyl-1,4-benzoquinone, methoxy-1,4-benzoquinone, phenyl-1,4-benzoquinone, 1,4-naphthoquinone and so on. Among the adducts of these phosphine compounds and quinone compounds, an adduct of triphenyl phosphine and 1,4-benzoquinone is preferably used. A method of making the adduct of the phosphine compound and the quinone compound is not limited to any method. For example, however, such an adduct can be obtained by making an addition reaction in an organic solvent in which the phosphine compound and the quinone compound material are dissolved, and then separating the product The adduct of the phosphine compound and the quinone compound may be used solely, or may be used as a mixture or blend.

In the epoxy resin composition of the present invention, a coupling agent may be added if necessary. In this context, the coupling agent means a coupling agent typically used for a surface treatment of inorganic materials. Examples of them include silane coupling agents such as amino silanes, epoxy silanes, mercapto silanes, alkyl silanes, ureido silanes, vinyl silanes or silazanes, otherwise titanate coupling agents, aluminum coupling agents, aluminum/zirconium coupling agents and so on. Among them, the most preferable one is the silane coupling agents, especially amino silanes, epoxy silanes, mercapto silanes, ureido silanes. Specific examples of them include γ-aminopropyltriethoxy silane, γ-aminopropyltrimethoxy silane, N-β(aminoethyl)γ-aminopropyltrimethoxy silane, N-β(aminoethyl)γ-aminopropylmethyldimethoxy silane, N-phenyl γ-aminopropyltriethoxy silane, N-phenyl γ-aminopropyltrimethoxy silane, N-β(aminoethyl)γ-aminopropyltriethoxy silane, N-6-(aminohexyl)3-aminopropyltrimethoxy silane, N-(3-(trimethoxysilylpropyl)-1,3-benzenedimethanane, γ-glycidoxypropyltriethoxy silane, γ-glycidoxypropyltrimethoxy silane, γ-glycidoxypropylmethyldimethoxy silane, β-(3,4 epoxy cyclohexyl)ethyltrimethoxy silane, γ-mercaptopropyltrimethoxy silane, γ-ureidopropyltriethoxy silane, hexamethyldisilazane and so on. These compounds used in the present invention may be one kind, or may be plural kinds. Also, these coupling agents may be hydrolyzed in advance by adding water, if necessary acid or alkali thereto.

The inorganic filler (D) of the present invention contains the spherical fused silica (d1). The spherical silica (d1) further contains the metal or semimetal other than silicon and/or the inorganic compound comprising the metal or semimetal other than silicon. Thereby, the chemical structure and the nature of the spherical fused silica are changed. Therefore, it is possible to provide the epoxy resin composition for semiconductor encapsulating use having an excellent flowability and an excellent solder reflow resistance.

The detail of the inorganic filler (D) will be discussed later in each case of the first to third embodiments.

The epoxy resin composition of the present invention contains components (A) to (D) as essential components, and further contains the coupling agent as an optional component if necessary. In the present invention, various additives as other optional components may be further added to the epoxy resin composition if necessary Examples of such various additives include a colorant such as carbon black, a release agent such as natural wax or synthesized wax, low stress additives such as rubber, flame retardant such as brominated epoxy resin, antimony trioxide, aluminum hydroxide, magnesium hydroxide, zinc borate, zinc molybdate or phosphazene, and so on.

The epoxy resin composition of the present invention can be obtained by mixing homogeneously the components (A) to (D), and the optional additives which may be added depending on the occasion, by means of a mixer or the like, then melting/kneading by means of a hot roll or kneader, then cooling and then crushing.

A semiconductor device of the present invention can be made by encapsulating various electronic components such as semiconductor elements with the epoxy resin composition of the present invention through a conventional molding method such as transfer molding, compression molding or injection molding.

Now, the first to third embodiments are specifically described.

First Embodiment

The first embodiment of the present invention is an epoxy resin composition for semiconductor encapsulating use comprising: an epoxy resin (A); a phenol resin (B); a curing accelerator (C); and an inorganic filler (D), characterized in that the inorganic filler (D) contains a spherical fused silica (d1) obtained by fusing silica which contains: metal or semimetal other than silicon; and/or an inorganic compound comprising the metal or semimetal other than silicon, and an extract of the spherical fused silica (d1) has a pH value no less than 3 and no more than 5.

The components (A) to (D) and other components which are added depending on the occasion are already described above.

In the present invention, the "extract" means an eluate obtained by shaking 30 g of silica as sample in 120 g of ion exchange water for 1 minute at a room temperature, and "the pH value of the extract" means a value obtained by measuring a pH value of such an eluate with a pH meter or the like.

Generally, examples of the inorganic filler suitably used for the resin composition for semiconductor encapsulating use include a silica filler such as a spherical fused silica obtained through thermofusion, or a spherical silica obtained by reacting metallic silicon with oxygen. Particularly, the spherical fused silica is widely used in view of the flowability, the gold wire sweep and the solder reflow resistance of the composition. Usually, the extract of such a spherical fused silica has a pH value no less than 5 and no more than 6.5.

In the present invention, however, the spherical silica (d1) contains the metal or semimetal other than silicon and/or the inorganic compound comprising the metal or semimetal other than silicon. Thereby, the chemical structure and the nature of the spherical fused silica are changed. Therefore, it is possible to provide the epoxy resin composition for semiconductor encapsulating use having an excellent flowability and an excellent solder reflow resistance.

In the case that the pH value of the extract is in a range from 3 to 5 (no less than 3 and no more than 5) by changing the chemical structure and the nature of the spherical fused silica, it is possible to provide the epoxy resin composition for semiconductor encapsulating use having an remarkably excellent flowability and an remarkably excellent solder reflow resistance.

As the metal or semimetal other than silicon and/or the inorganic compound comprising the metal or semimetal other than silicon (thereinafter may be simply called "impurities") to be contained in the spherical fused silica for a purpose of lowering a pH value of the extract to a range from 3 to 5, it is referable to use the metal or semimetal other than silicon and/or the inorganic compound comprising the metal or semimetal other than silicon providing a metal or semimetal ion whose ion charge number is not more than 3, more preferably the inorganic compound comprising the metal or semimetal other than silicon providing the metal or semimetal ion whose ion charge number is not more than 3, still more preferably an oxide of the metal or semimetal other than silicon providing the metal or semimetal ion whose ion charge number is not more than 3.

The metal or semimetal other than silicon providing the metal or semimetal ion whose ion charge number is not more than 3 is not limited to any special metal or semimetal, but may be Al, Zn, Ga, In, Cu, Ag, Co, Ni, B, Zr, Ti and so on. Among them, Al, Zn, Ga, Zr, B and Ti are preferable, from the viewpoint of ion migration or magnetism.

The content ratio of the metal or semimetal other than silicon and/or the inorganic compound comprising the metal or semimetal other than silicon in the silica filler such as the spherical fused silica can be determined for example by measuring a solution of a sample dissolved in hydrofluoric acid with a high frequency plasma spectrometer, and then calculating the measured value.

In the first embodiment of the present invention, when a pH value of the extract of the spherical fused silica is in a range from 3 to 5, preferably from 4 to 5 by intentionally containing the impurities in the spherical fused silica, it is possible to provide the epoxy resin composition for semiconductor encapsulating use having a remarkably excellent flowability and a remarkably excellent solder reflow resistance. It is considered that the reactivity with a surfactant of the silica, especially with a basic surfactant is improved, because that the pH value of the spherical fused silica is lower than that of the conventional spherical fused silica. It is considered thereby that the compatibility between the silica and the resin is improved, so that the resin composition for semiconductor encapsulating use can be obtained with excellent properties such as an excellent flowability or an excellent solder reflow resistance. If the pH value of the extract exceeds the upper limit 5, it is difficult to see the difference from the conventional fused silica whose extract has a pH value more than 5, in view of the effect of improving the flowability and the solder reflow resistance. If the pH value of the extract is less than the lower limit 3, the reactivity with a coupling agent or the like becomes disadvantageously strong because of its strong acidity. The metal or semimetal other than silicon and/or the inorganic compound comprising the metal or semimetal other than silicon to be used in the present invention are/is not limited to one kind, but plural kinds of them can be used.

The spherical fused silica (d1) to be used for the first embodiment of the present invention is not limited to any special size. However, it is preferable to use the spherical fused silica (d1) having an average particle size no less than 0.2 μm and no more than 50 μm. If the average particle size is within the above range, it is possible to prevent the solder reflow resistance from being lowered which may be caused by a fact that a filler density in the resin remarkably decreases, or prevent the particles from aggregating each other. The average particle size of the inorganic filler to be used in the present invention can be determined by means of a laser particle size analyzer (e.g. SALD-7000 available from SHIMADZU CORPORATION).

As the inorganic filler (D) to be used for the first embodiment of the present invention, other inorganic fillers generally used for the conventional epoxy resin composition for semiconductor encapsulating use may be used in addition to the spherical fused silica (d1) whose chemical structure is changed by intentionally containing the impurities. Examples of other inorganic fillers which may be used with the spherical fused silica (d1) include conventional fused silica whose extract has a pH value more than 5 as usual, crystalline silica, talc, alumina, silicon nitride, and so on. Among them, the most preferable one is the conventional spherical fused silica whose extract has a pH value more than 5 as usual. These other inorganic fillers used with the spherical fused filler (d1) of the present invention may be only one kind, or may be plural kinds. In the case that the conventional spherical fused silica whose extract has a pH value more than 5 is used with the spherical fused silica (d1) whose extract has a pH value no less than 3 and no more than 5, the content ratio of the latter relative to the former is preferably at least 6:4 (i.e. a content ratio of the spherical fused silica (d1) whose extract has a pH value no less than 3 and no more than 5 is not less than 6).

A content ratio of the spherical fused silica (d1) in the first embodiment of the present invention is preferably not less than 40 weight percent and not more than 94 weight percent, more preferably not less than 60 weight percent and not more than 93 weight percent, still more preferably not less than 75 weight percent and not more than 93 weight percent, relative to the epoxy resin composition as a whole. If the content ratio is within the above range, the effect of improving the flowability and the solder reflow resistance can be sufficiently obtained.

A content ratio of the inorganic filler (D) containing the spherical fused silica (d1) in the first embodiment of the present invention is preferably not less than 78 weight percent and not more than 94 weight percent, relative to the epoxy resin composition as a whole. If the content ratio is within the above range, the effect of improving the flowability and the solder reflow resistance can be sufficiently obtained.

Second Embodiment

Now, an explanation is made on the second embodiment of the present invention. Many parts of the second embodiment are common with the first embodiment. Therefore, the following explanation is mainly focused on the parts of the second embodiment different from the first embodiment.

The second embodiment of the present invention is an epoxy resin composition for semiconductor encapsulating use comprising: an epoxy resin (A); a phenol resin (B); a curing accelerator (C); and an inorganic filler (D), wherein the inorganic filler (D) contains a spherical fused silica (d1) obtained by fusing silica which contains: metal or semimetal other than silicon; and/or an inorganic compound comprising the metal or semimetal other than silicon, and characterized in that the inorganic compound comprising the metal or semimetal other than silicon is titanium oxide, and the spherical fused silica (d1) is a eutectic mixture (d2) of silicon dioxide and titanium oxide. Thereby, there is provided an epoxy resin composition or semiconductor encapsulating use having an excellent flowability and an excellent moldability, as well as a semiconductor device having an excellent solder reflow resistance.

The epoxy resin (A), phenol resin (B) and curing accelerator (C) to be used for the second embodiment of the present invention are the same as in the first embodiment.

The content ratios of the epoxy resin (A) and phenol resin (B) are the same as in the first embodiment.

In the second embodiment of the present invention, a eutectic mixture (d2) of silicon dioxide and titanium oxide is used as the inorganic filler (D). As described in the first embodiment, examples of the inorganic filler suitably used for the resin composition for semiconductor encapsulating use include a silica filler such as a spherical silica obtained through thermofusion, or a spherical silica obtained by reacting metallic silicon with oxygen. The conventional silica filler usually contains silicon dioxide at a content ratio more than 99.8 weight percent.

The spherical fused silica is widely used in view of the flowability, the gold wire sweep and the solder reflow resistance of the composition. This conventional spherical silica also contains a small amount of impurities such as alumina. It is understood that the impurities such as alumina are originated from a mined silica material itself which contains a very small amount of the impurities from the first, or contaminated in the course of making or crushing process. However, such a conventional fused silica contains the impurities such as alumina only at a content ratio less than 0.2 weight percent. Therefore, the conventional fused silica is different from the eutectic mixture of silicon dioxide and titanium oxide to be used in the present invention. The eutectic mixture to be used in the present invention is obtained by thermofusing silica material intentionally with titanium oxide or titanium so as to contain titanium oxide at a content ratio no less than 0.2 weight percent. In the present invention, the explanation is focused on titanium dioxide ($TiO_2$) having the oxidation number IV as the "titanium oxide", but the "titanium oxide" of the present invention includes other various phases of "titanium oxide" such as Magneli phase $Ti_nO_{2n-1}$ (n=4 to 9), a substantially stoichiometric compound $Ti_2O_5$ or $Ti_2O_3$, a substantially non-stoichiometric compound TiO ($Ti_{1+x}O$, x=−0.23~+0.25), a phase $TiO_x$ (x<0.5) that an oxygen atom is positioned in an octahedron constituting a hexagonal closest packed structure of metallic titanium, and other phases $Ti_6$, $Ti_3O$, $Ti_2O$. A content ratio of titanium oxide may be changed by a method of mixing the silica material with titanium oxide before thermofusing the silica material, or a method of thermofusing the silica material containing a relatively larger amount of titanium oxide as an impurity from the first. The eutectic mixture of silicon dioxide and titanium oxide can be obtained not only by thermofusing the silica material, but also by reacting metallic silicon and metallic titanium with oxygen. By using the eutectic mixture of silicon dioxide and titanium oxide, the reactivity with the surfactant such as silane coupling agent which is typically added to the composition can be improved. Thereby, the resin composition for semiconductor encapsulating use can be obtained with an excellent flowability and an excellent solder reflow resistance.

Preferably, in the eutectic mixture of silicon dioxide and titanium oxide according to the second embodiment of the present invention, a content ratio of the silicon dioxide is not less than 20 weight percent and not more than 99.8 weight percent, and a content ratio of the titanium oxide is not less than 0.2 weight percent and not more than 80 weight percent. Furthermore, the lower limit of the content ratio of the silicon dioxide is more preferably 80 weight percent, still more preferably 95 weight percent. The upper limit of the content ratio of the titanium oxide is more preferably 20 weight percent, still more preferably 5 weight percent. If the content ratio of the silicon dioxide exceeds the upper limit, it is difficult to see the difference from the conventional thermofused silica, in view of the effect of improving the flowability and the solder reflow resistance. If the content ratio of the silicon dioxide is less than the lower limit, the flowability of the resin composition for semiconductor encapsulating use may be decreased. Additionally, the eutectic mixture of silicon dioxide and titanium oxide may contain alumina ($Al_2O_3$), zirconia ($ZrO_2$), ferric oxide ($Fe_2O_3$) and so on. A content ratio of titanium oxide in the eutectic mixture or in the thermofused silica can be determined by measuring a solution of a sample dissolved in hydrofluoric acid with a high frequency plasma spectrometer, and then calculating the measured value.

The average particle size of the eutectic mixture (d2) of silicon dioxide and titanium oxide according to the second embodiment of the present invention is not limited to any special size, but preferably not less than 0.2 μm and not more than 50 μm, as in the case of the first embodiment. If the average particle size exceeds the upper limit, a filler density in the resin may remarkably decrease, and thereby the solder reflow resistance may be deteriorated. If the average particle size is less than the lower limit, it may become disadvantageously difficult to prevent the particles from aggregating each other. The average particle size of the inorganic filler to be used in the present invention can be determined by means of a laser particle size analyzer (e.g. SALD-7000 available from SHIMADZU CORPORATION) or the like.

As the inorganic filler (D) according to the second embodiment of the present invention, other inorganic fillers generally used for the conventional epoxy resin composition for semiconductor encapsulating use may be used in addition to the eutectic mixture (d2) of silicon dioxide and titanium oxide. Examples of other inorganic fillers which may be used with the eutectic mixture (d2) include conventional fused silica, crystalline silica, talc, alumina, silicon nitride, and so on. Among them, the most preferable one is the conventional spherical fused silica. These other inorganic fillers used with the eutectic mixture (d2) of the present invention may be only one kind, or may be plural kinds.

Preferably, a content ratio of the eutectic mixture (d2) of silicon dioxide and titanium oxide in the second embodiment of the present invention is not less than 8 weight percent and not more than 93 weight percent relative to the epoxy resin composition as a whole, more preferably not less than 40 weight percent and not more than 93 weight percent, still more preferably not less than 65 weight percent and not more than 91 weight percent, especially not less than 80 weight percent and not more than 90 weight percent. If the content ratio is less than the lower limit, the effect of using the eutectic mixture of silicon dioxide and titanium oxide is weakened, so that an effect of improving the flowability and the solder reflow resistance may not be obtained sufficiently. If the content ratio exceeds the upper limit, the sufficient flowability may not be obtained.

Preferably, a content ratio of the inorganic filler (D) containing the eutectic mixture (d2) of silicon dioxide and titanium oxide in the second embodiment of the present invention is not less than 78 weight percent and not more than 93 weight percent relative to the epoxy resin composition as a whole, more preferably not less than 83 weight percent and not more than 91 weight percent. If the content ratio is less than the lower limit, the sufficient solder reflow resistance may not be obtained. If the content ratio exceeds the upper limit, the sufficient flowability may not be obtained.

Third Embodiment

Now, an explanation is made on the third embodiment of the present invention. Many parts of the third embodiment are common with the first and second embodiments. Therefore, the following explanation is mainly focused on the parts of the third embodiment different from the first and second embodiments.

The third embodiment of the present invention is an epoxy resin composition for semiconductor encapsulating use comprising: an epoxy resin (A); a phenol resin (B); a curing accelerator (C); and an inorganic filler (D), wherein the inorganic filler (D) contains a spherical fused silica (d1) obtained by fusing silica which contains: metal or semimetal other than silicon; and/or an inorganic compound comprising the metal or semimetal other than silicon, and characterized in that the inorganic compound comprising the metal or semimetal other than silicon is alumina, and the spherical fused silica (d1) is a eutectic mixture (d3) of silicon dioxide and alumina, wherein a content ratio of the silicon dioxide in the eutectic mixture (d3) is not less than 80 weight percent and not more than 99.8 weight percent, and a content ratio of the alumina in the eutectic mixture (d3) is not less than 0.2 weight percent and not more than 20 weight percent. Thereby, there is provided an epoxy resin composition for semiconductor encapsulating use having an excellent flowability and an excellent moldability, as well as a semiconductor device having an excellent solder reflow resistance.

The epoxy resin (A), phenol resin (B) and curing accelerator (C) to be used for the third embodiment of the present invention are the same as in the first and second embodiments.

The content ratios of the epoxy resin (A) and phenol resin (B) are the same as in the first and second embodiments.

In the third embodiment of the present invention, a eutectic mixture (d3) of silicon dioxide ($SiO_2$) and alumina ($Al_2O_3$) is used as the inorganic filler (D). As described in the first and second embodiments, examples of the inorganic filler suitably used for the resin composition for semiconductor encapsulating use include a silica filler such as a spherical silica obtained through thermofusion, or a spherical silica obtained by reacting metallic silicon with oxygen. The conventional silica filler usually contains silicon dioxide at a content ratio more than 99.8 weight percent.

The spherical fused silica is widely used, in view of the flowability, the gold wire sweep and the solder reflow resistance. The conventional spherical fused silica also contains a small amount of impurities such as alumina ($Al_2O_3$). It is understood that the impurities such as alumina are originated from a mined silica material itself which contains a very small amount of the impurities from the first, or contaminated in the course of making or crushing process. However, such a conventional fused silica contains the impurities such as alumina only at a content ratio less than 0.2 weight percent. Therefore, the conventional fused silica is different from the eutectic mixture (d3) of silicon dioxide ($SiO_2$) and alumina ($Al_2O_3$) to be used in the present invention. The eutectic mixture (d3) to be used in the third embodiment of the present invention is obtained by thermofusing silica material intentionally with the content ratio of alumina ($Al_2O_3$) being changed, so as to contain alumina at a content ratio no less than 0.2 weight percent and no more than 20 weight percent. A content ratio of alumina ($Al_2O_3$) may be changed by a method of mixing the silica material with alumina before thermofusing the silica material, or a method of thermofusing the silica material containing a relatively larger amount of alumina as an impurity from the first. The eutectic mixture (d3) of silicon dioxide and alumina can be obtained not only by thermofusing the silica material, but also by reacting metallic silicon and metallic aluminum with oxygen. By using the eutectic mixture (d3) of silicon dioxide and alumina, the surface pH or surface reactivity of the inorganic filler changes. Thereby, the resin composition for semiconductor encapsulating use can be obtained with an excellent flowability and an excellent solder reflow resistance, as well as an excellent reliability in a high temperature environment or in a moisture environment.

Preferably, in the eutectic mixture (d3) of silicon dioxide and alumina according to the third embodiment of the present invention, a content ratio of the silicon dioxide is not less than 80 weight percent and not more than 99.8 weight percent, and a content ratio of the alumina is not less than 0.2 weight percent and not more than 20 weight percent. If the content ratio of the silicon dioxide exceeds the upper limit, it is difficult to see the difference from the conventional thermofused silica, in view of the effect of improving the flowability and the solder reflow resistance. If the content ratio of the silicon dioxide is less than the lower limit, the flowability of the resin composition for semiconductor encapsulating use is disadvantageously decreased. Additionally, the eutectic mixture (d3) of silicon dioxide and alumina may contain titanium oxide ($TiO_2$), zirconia ($ZrO_2$), ferric oxide ($Fe_2O_3$) and so on. A content ratio of alumina in the eutectic mixture or in the thermofused silica can be determined by measuring a solution of a sample dissolved in hydrofluoric acid with a high frequency plasma spectrometer, and then calculating the measured value.

The average particle size of the eutectic mixture (d3) of silicon dioxide and alumina according to the third embodiment of the present invention is not limited to any special size, but preferably not less than 0.2 µm and not more than 50 µm, as in the case of the first and second embodiments. If the average particle size exceeds the upper limit, a filler density in the resin may remarkably decrease, and thereby the solder reflow resistance may be deteriorated. If the average particle size is less than the lower limit, it may become disadvantageously difficult to prevent the particles from aggregating each other. The average particle size of the inorganic filler to be used in the present invention can be determined by means of a laser particle size analyzer (e.g. SALD-7000 available from SHIMADZU CORPORATION) or the like.

As the inorganic filler (D) according to the third embodiment of the present invention, other inorganic fillers generally used for the conventional epoxy resin composition for semiconductor encapsulating use may be used in addition to the eutectic mixture (d3) of silicon dioxide and alumina. Examples of other inorganic fillers which may be used with the eutectic mixture (d3) include conventional fused silica, crystalline silica, talc, alumina, silicon nitride, and so on, as in the case of the second embodiment. Among them, the most preferable one is the conventional spherical fused silica. These other inorganic fillers used with the eutectic mixture (d3) of the present invention may be only one kind, or may be plural kinds.

Preferably, a content ratio of the eutectic mixture (d3) of silicon dioxide and alumina in the third embodiment of the present invention is not less than 8 weight percent and not more than 93 weight percent relative to the epoxy resin composition as a whole, more preferably not less than 35 weight percent and not more than 93 weight percent, still more preferably not less than 65 weight percent and not more than 93 weight percent, especially not less than 75 weight percent and not more than 93 weight percent. If the content ratio is less than the lower limit, the effect of using the eutectic mixture (d3) of silicon dioxide and alumina is weakened, so that an effect of improving the flowability and the solder reflow resistance may not be obtained sufficiently. If the content ratio exceeds the upper limit, the sufficient flowability may not be obtained.

Preferably, a content ratio of the inorganic filler (D) containing the eutectic mixture (d3) of silicon dioxide and alumnina in the third embodiment of the present invention is not less than 78 weight percent and not more than 93 weight percent relative to the epoxy resin composition as a whole. If the content ratio is less than the lower limit, the sufficient solder reflow resistance may not be obtained. If the content ratio exceeds the upper limit, the sufficient flowability may not be obtained.

EXAMPLES

The present invention will be more apparent from the following Examples corresponding to the first to third embodiments. The following examples are not intended to limit the scope of the invention, but presented merely for an illustration purpose. In the following Examples, a content ratio is expressed in weight part unless specifically noted otherwise. Furthermore, an abbreviation unit "wt. %" means "weight percent".

Examples of First Embodiment

The inorganic fillers used in Examples and Comparative Examples according to the first embodiment are listed below.

A pH value of the extract of the silica filler such as the spherical fused silica, the spherical silica and the crushed silica was determined by measuring with a pH-meter ("HM-30S" available from TOA) the extract which was obtained by shaking the silica sample 30 g in ion exchange water 120 g for 1 minute at a room temperature.

A content of impurities in the silica filler was determined by measuring a solution of a sample dissolved in hydrofluoric acid with a high frequency plasma spectrometer ("ICPS-1000IV" available from Shimadzu Corporation), and then calculating the measured value.

(List of Inorganic Filler)

Inorganic filler 1a; a spherical fused silica; the extract pH=4.8; average particle size=33.4 μm; specific surface=1.6 $m^2/g$; $SiO_2$=99.6 wt. %; $Al_2O_3$=0.4 wt. %.

Inorganic filler 2a: a spherical fused silica; the extract pH=4.1; average particle size=32.3 μm; specific surface=1.9 $m^2/g$; $SiO_2$=95.4 wt. %; $Al_2O_3$=4.6 wt. %.

Inorganic filler 3a: a spherical fused silica; the extract pH=4.9; average particle size=31.4 μm; specific surface=1.6 $m^2/g$; $SiO_2$=99.4 wt. %; ZnO=0.6 wt. %.

Inorganic filler 4a: a spherical fused silica; the extract pH=4.3; average particle size=29.2 μm; specific surface=1.8 $m^2/g$; $SiO_2$=88.7 wt. %; ZnO=11.3 wt. %.

Inorganic filler 5a: a spherical fused silica; the extract pH=4.7; average particle size=33.9 μm; specific surface=1.7 $m^2/g$; $SiO_2$=99.4 wt. %; $B_2O_3$=0.6 wt. %.

Inorganic filler 6a: a spherical fused silica; the extract pH=4.6; average particle size=33.9 μm; specific surface=1.7 $m^2/g$; $SiO_2$=98.4 wt. %; $Al_2O_3$=0.9 wt. %; $B_2O_3$=0.7 wt. %.

Inorganic filler 7a: a spherical fused silica; the extract pH=5.5; average particle size=32.1 μm; specific surface=1.5 $m^2/g$; $SiO_2$=99.99 wt. %.

Inorganic filler 8a: a spherical silica obtained by reacting metallic silicon with oxygen; the extract pH=5.3; average particle size=0.6 μm; specific surface=6.2 $m^2/g$; $SiO_2$=99.9 wt. %; impurities 32 0.1 wt. %.

Inorganic filler 9a: a crushed silica; the extract pH=5.8; average particle size=30.5 μm; specific surface=1.8 $m^2/g$; $SiO_2$=99.9 wt. %; impurities =0.1 wt. %.

Example 1a

The following ingredients were mixed by means of a hot roll for 8 minutes at 95° C. Then, the mixture was cooled and then crushed, so that the epoxy resin composition was obtained. The obtained epoxy resin composition was evaluated as described below. The result of evaluation is shown in Table 1a.

(Ingredients)

Epoxy resin 1a=68 wt. parts: biphenyl type epoxy resin "YX-4000" available from Japan Epoxy Resins Co.,Ltd.; epoxy equivalent=190 g/eq; melting point=105° C.

Phenol resin 1a=48 wt. parts: phenol aralkyl resin having a phenylene skeleton "XLC-LL" available from Mitsui Chemicals, Inc.; hydroxy equivalent=165 g/eq; softening point=79° C.

Curing accelerator 1a=3 wt. parts: 1,8-diazabicyclo(5,4,0)undecene-7.

Inorganic filler 1a=770 wt. parts.
Inorganic filler 8a=100 wt. parts.
Coupling agent 1a=3 parts: N-phenyl γ-aminopropyltriethoxy silane.
Carbon black=3 wt. parts.
Carnauba wax=5 wt. parts.

(Evaluation)

(Spiral Flow)

The epoxy resin composition to be evaluated was injected into a mold for a spiral flow measurement compatible with EMMI-1-66, through a low pressure transfer molding machine ("KTS-15" available from KOHTAKI Corporation), under such a condition that the mold temperature was 175° C., the injection pressure was 6.9 MPa, and the curing time was 120 seconds. Then, the flow length was measured, on the basis of "cm" unit. The resin composition having the flow length no less than 100 cm was evaluated as the resin composition having the good flowability.

(Gold Wire Sweep)

There was molded a 160p-LQPF (160 pin Low Profile Quad Flat Pack) package in which a PPF frame (pre-plated frame) was used, the package size was 24 mm by 24 mm by 1.4 mm, the chip size was 7.0 mm by 7.0 mm, the gold wire thickness was 25 μm, and the gold wire length was 3 mm, through a low pressure transfer molding machine ("GP-ELF" available from Dai-ichi Seiko Co., Ltd.), under such a condition that the molding temperature was 175° C., the pressure was 9.3 MPa, the curing time was 120 seconds. The molded package was observed by means of a soft X-ray transmission microscope ("PRO-TEST 100" available from SOFTEX Corporation), so that the deformation of the gold wire was evaluated as a ratio of "flow length" to "gold wire length" (.e. "flow length"/"gold wire length") with percent basis. The epoxy resin composition having the deformation no more than 4% was evaluated as the composition suitable for semiconductor encapsulating use with less gold wire sweep.

(Solder Reflow Deformation)

There was molded a 160p-LQPF package in which a PPF frame was used, the package size was 24 mm by 24 mm by 1.4 mm, the chip size was 7.0 mm by 7.0 mm, through a low pressure transfer molding machine ("GP-ELF" available from Dai-ichi Seiko Co., Ltd.), under such a condition that the molding temperature was 175° C., the pressure was 8.3 MPa, the curing time was 120 seconds. The molded package was subjected to the after-baking process for 8 hours at 175° C. Then, the after-baked package was subjected to the humidifying process for 120 hours at 60° C., 60% RH (Relative Humidity). Then, the package was subjected to the IR reflow process for hours at 260° C. reflow machine "1812EXL-S" available from Heller Industries was used). Separation and crack inside of the package were observed by means of an ultrasonic reflectoscope ("mi-scope 10" available from Hitachi Kenki FineTech Co., Ltd.). The number of the packages having any separation or crack was counted among 10 packages. When this number was zero, the epoxy resin composition was evaluated as the composition having a good solder reflow resistance.

Examples 2a to 14a, Comparative Examples 1a to 5a

Epoxy resin compositions were obtained almost in the same way as Example 1a, except that ingredients of each composition were varied as shown in Tables 1a to 3a. The obtained compositions were evaluated in the same way as Example 1a. The results were shown in Tables 1a to 3a.

Ingredients which were different from ingredients used in Example 1a are shown below.

(Ingredients Different from Example 1a)

Epoxy resin 2a: phenol aralkyl type epoxy resin having biphenylene skeleton "NC3000P" available from NIPPON KAYAKU.CO.JP; softening point=58° C.; epoxy equivalent=273.

Phenol resin 2a: phenol aralkyl resin having biphenylene skeleton "MEH-7851SS" available from MEIWA PLASTIC INDUSTRIES, LTD.; softening point=107° C.; hydroxy equivalent=204.

Curing accelerator 2a: triphenyl phosphine-1,4-benzoquinone.

Coupling agent 2a: γ-aminopropyltriethoxy silane.

TABLE 1a

|  | Examples | | | | | | |
| --- | --- | --- | --- | --- | --- | --- | --- |
|  | 1a | 2a | 3a | 4a | 5a | 6a | 7a |
| Epoxy resin 1a | 68 | | | | | | |
| Epoxy resin 2a |  | 72 | 72 | 72 | 72 | 72 | 72 |
| Phenol resin 1a | 48 | | | | | | |
| Phenol resin 2a |  | 44 | 44 | 44 | 44 | 44 | 44 |
| Curing accelerator 1a |  | 3 | | | | | |
| Curing accelerator 2a | 3 | | 3 | 3 | 3 | 3 | 3 |
| Inorganic filler 1a | 770 | 770 | 870 | 770 | | | |
| Inorganic filler 2a | | | | | 770 | | |
| Inorganic filler 3a | | | | | | 770 | |
| Inorganic filler 4a | | | | | | | 770 |
| Inorganic filler 8a | 100 | 100 | | 100 | 100 | 100 | 100 |
| Coupling agent 1a | 3 | 3 | 3 | 3 | 3 | 3 | 3 |
| Carbon black | 3 | 3 | 3 | 3 | 3 | 3 | 3 |
| Carnauba wax | 5 | 5 | 5 | 5 | 5 | 5 | 5 |
| Spiral flow(cm) | 172 | 103 | 102 | 121 | 115 | 128 | 104 |
| Gold wire sweep(%) | 2 | 4 | 4 | 3 | 4 | 2 | 4 |
| Solder reflow resistance (Defect lot in ten lots) | 0 | 0 | 0 | 0 | 0 | 0 | 0 |

TABLE 2a

|  | Examples | | | | | | |
| --- | --- | --- | --- | --- | --- | --- | --- |
|  | 8a | 9a | 10a | 11a | 12a | 13a | 14a |
| Epoxy resin 2a | 72 | 72 | 72 | 41 | 90 | 116 | 72 |
| Phenol resin 2a | 44 | 44 | 44 | 25 | 56 | 70 | 44 |
| Curing accelerator 2a | 3 | 3 | 3 | 3 | 3 | 3 | 3 |
| Inorganic filler 1a |  |  | 770 | 820 | 740 | 700 | 450 |
| Inorganic filler 5a | 770 | | | | | | |
| Inorganic filler 6a |  | 770 | | | | | |
| Inorganic filler 7a |  |  |  |  |  |  | 320 |
| Inorganic filler 8a | 100 | 100 | 100 | 100 | 100 | 100 | 100 |
| Coupling agent 1a | 3 | 3 |  | 3 | 3 | 3 | 3 |
| Coupling agent 2a |  |  | 3 | | | | |
| Carbon black | 3 | 3 | 3 | 3 | 3 | 3 | 3 |
| Carnauba wax | 5 | 5 | 5 | 5 | 5 | 5 | 5 |
| Spiral flow(cm) | 117 | 115 | 108 | 106 | 131 | 155 | 109 |
| Gold wire sweep(%) | 3 | 3 | 4 | 3 | 2 | 1 | 3 |
| Solder reflow resistance (Defect lot in ten lots) | 0 | 0 | 0 | 0 | 0 | 0 | 0 |

TABLE 3a

|  | Comparative Examples | | | | |
| --- | --- | --- | --- | --- | --- |
|  | 1a | 2a | 3a | 4a | 5a |
| Epoxy resin 2a | 72 | 72 | 23 | 72 | 72 |
| Phenol resin 2a | 44 | 44 | 13 | 44 | 44 |
| Curing accelerator 2a | 3 | 3 | 3 | 3 | 3 |
| Inorganic filler 7a |  | 870 | 950 | 770 | 770 |
| Inorganic filler 8a |  |  |  | 100 | 100 |
| Inorganic filler 9a | 870 | | | | |
| Coupling agent 1a | 3 | 3 | 3 | 3 |  |
| Coupling agent 2a |  |  |  |  | 3 |
| Carbon black | 3 | 3 | 3 | 3 | 3 |
| Carnauba wax | 5 | 5 | 5 | 5 | 5 |
| Spiral flow(cm) | 16 | 68 | 7 | 86 | 81 |
| Gold wire sweep(%) | Failure | 9 | Failure | 7 | 8 |
| Solder reflow resistance (Defect lot in ten lots) | Failure | 10 | Failure | 10 | 6 |

(Result of Evaluation for Resin Composition of First Embodiment)

As apparent from Tables 1a to 3a, the epoxy resin compositions in Examples according to the present invention exhibited the good values of spiral flow test which are indicators of the flowability, and exhibited the low values of the gold wire sweep test which are indicators of the flowability or the indicators of molding defect which may cause an electric failure of the package. Furthermore, no defect package was found among the samples, which means that the solder reflow resistance is good.

On the other hand, the epoxy resin compositions in Comparative Examples containing no spherical fused silica whose extract has a pH value no less than 3 and no more than 5 exhibited the values of spiral flow test lower than that of Examples by one or two figures. As for epoxy resin compositions in Comparative Examples 1a and 3a, the gold wire sweep and the solder reflow resistance could not be evaluated, because of low flowability. As for the epoxy resin compositions in Comparative Examples 2a, 4a and 5a, the evaluated values of the gold wire sweep test were out of the allowable range, and all or majority of samples had defects, which means the low solder reflow resistance.

Examples of Second Embodiment

The inorganic fillers (D) used in Examples and Comparative Examples according to the second embodiment are listed below.

A content ratio of titanium oxide in a silica filler or in a eutectic mixture of silicon dioxide and titanium dioxide was determined by measuring a solution of a sample dissolved in hydrofluoric acid with a high frequency plasma spectrometer ("ICPS-1000 IV" available from Shimadzu Corporation), and then calculating the measured value.

(List of Inorganic Filler)

Inorganic filler 1b: a eutectic mixture of silicon dioxide and titanium oxide which is a spherical inorganic filler obtained by adding titanium oxide powder to silica material and then thermofusing them; average particle size=30.4 μm; specific surface=1.6 m$^2$/g; SiO$_2$=99 wt. %; titanium oxide=1 wt. %.

Inorganic filler 2b: a eutectic mixture of silicon dioxide and titanium oxide which is a spherical inorganic filler obtained by adding titanium oxide powder to silica material and then thermofusing them; average particle size=26.2 μm; specific surface=1.9 m$^2$/g; SiO$_2$=75 wt. %; titanium oxide=25 wt. %.

Inorganic filler 3b: a eutectic mixture of silicon dioxide and titanium oxide which is a spherical inorganic filler obtained by adding titanium oxide powder to silica material and then thermofusing them; average particle size=26.4 μm; specific surface=2.8 m$^2$/g; SiO$_2$=50 wt. %; titanium oxide=50 wt. %.

Inorganic filler 4b: a eutectic mixture of silicon dioxide and titanium oxide which is a spherical inorganic filler obtained by adding titanium oxide powder to silica material and then thermofusing them; average particle size=26.4 μm; specific surface=2.8 m$^2$/g; SiO$_2$=25 wt. %; titanium oxide=75 wt. %.

Inorganic filler 5b: a eutectic mixture of silicon dioxide and titanium oxide which is a spherical inorganic filler obtained by adding titanium oxide powder to silica material and then thermofusing them; average particle size=26.2 μm; specific surface=3.1 m$^2$/g; SiO$_2$=10 wt. %; titanium oxide=90 wt. %.

Inorganic filler 6b: a eutectic mixture of silicon dioxide and titanium oxide which is a spherical inorganic filler obtained by mixing metallic silicon with metallic titanium, and then reacting them with oxygen; average particle size=1.6 μm; specific surface=4.6 m$^2$/g; SiO$_2$=99.0 wt. %; titanium oxide=1.0 wt. %.

Inorganic filler 7b: a eutectic mixture of silicon dioxide and titanium oxide which is a spherical inorganic filler obtained by mixing metallic silicon with metallic titanium, and then reacting them with oxygen; average particle size=2.5 μm; specific surface=6.2 m$^2$/g; SiO$_2$=75.0 wt. %; titanium oxide=25.0 wt. %.

Inorganic filler 8b: a eutectic mixture of silicon dioxide and titanium oxide which is a spherical inorganic filler obtained by mixing metallic silicon with metallic titanium, and then reacting them with oxygen; average particle size=2.7 μm; specific surface=6.8 m$^2$/g; SiO$_2$=50.0 wt. %; titanium oxide=50.0 wt. %.

Inorganic filler 9b: a spherical fused silica; average particle size=28.8 μm; specific surface=1.5 m$^2$/g; SiO$_2$=99.9 wt. %; titanium oxide=0.00 wt. %.

Inorganic filler 10b: a spherical fused silica which is an inorganic filler obtained by reacting metallic silicon with oxygen; average particle size=1.5 μm; specific surface=4.2 m$^2$/g; SiO$_2$=99.9 wt. %; titanium oxide=0.00 wt. %.

Inorganic filler 11b: a crushed silica; average particle size=30.5 μm; specific surface=1.8 m$^2$/g; SiO$_2$=99.9 wt. %; titanium oxide=0.00 wt. %.

Example 1b

The following ingredients were mixed by means of a hot roll for 8 minutes at 95° C. Then, the mixture was cooled and then crushed, so that the epoxy resin composition was obtained. The obtained epoxy resin composition was evaluated in the same way as Example 1a. The result of evaluation is shown in Table 1b.

(Ingredients)

Epoxy resin 1b=68 wt. parts: biphenyl type epoxy resin "YX-4000" available from Japan Epoxy Resins Co., Ltd.; epoxy equivalent=190 g/eq; melting point=105° C.

Phenol resin 1b=48 wt. parts: phenol aralkyl resin having a phenylene skeleton "XLC-LL" available from Mitsui Chemicals, Inc.; hydroxy equivalent=165 g/eq; softening point=79° C.

Curing accelerator 1b=3 wt. parts: 1,8-diazabicyclo(5,4,0)undecene-7.

Inorganic filler 1b=770 wt. parts.

Inorganic filler 10b=100 wt. parts.

Coupling agent 1b=3 parts: γ-glycidoxypropyltrimethoxy silane.

Carbon black=3 wt. parts.

Carnauba wax=5 wt. parts.

Examples 2b to 17b and Comparative Examples 1b to 5b

Epoxy resin compositions were obtained almost in the same way as Example 1b, except that ingredients of each composition were varied as shown in Tables 1b to 3b. The obtained compositions were evaluated in the same way as Example 1b. The results were shown in Tables 1b to 3b.

Ingredients which were different from ingredients used in Example 1b are shown below.

(Ingredients Different from Example 1b)

Epoxy resin 2b: phenol aralkyl type epoxy resin having biphenylene skeleton "NC3000P" available from NIPPON KAYAKU.CO.JP; softening point=58° C.; epoxy equivalent=273.

Phenol resin 2b: phenol aralkyl resin having biphenylene skeleton "MEH-7851SS" available from MEIWA PLASTIC INDUSTRIES, LTD.; softening point=107° C.; hydroxy equivalent=204).

Curing accelerator 2b: triphenyl phosphine-1,4-benzoquinone.

Coupling agent 2b: N-phenyl γ-aminopropyltriethoxy silane.

Coupling agent 3b: γ-mercaptopropyltrimethoxy silane.

TABLE 1b

|  | Examples | | | | | | | | |
|---|---|---|---|---|---|---|---|---|---|
|  | 1b | 2b | 3b | 4b | 5b | 6b | 7b | 8b | 9b |
| Epoxy resin 1b | 68 | | | | | | | | |
| Epoxy resin 2b |  | 72 | 72 | 72 | 72 | 72 | 72 | 72 | 72 |
| Phenol resin 1b | 48 | | | | | | | | |
| Phenol resin 2b |  | 44 | 44 | 44 | 44 | 44 | 44 | 44 | 44 |
| Curing Accelerator 1b |  | 3 | | | | | | | |
| Curing Accelerator 2b | 3 |  | 3 | 3 | 3 | 3 | 3 | 3 | 3 |

TABLE 1b-continued

|  | Examples | | | | | | | | |
| --- | --- | --- | --- | --- | --- | --- | --- | --- | --- |
|  | 1b | 2b | 3b | 4b | 5b | 6b | 7b | 8b | 9b |
| Inorganic filler 1b | 770 | 770 | 870 | 770 |  |  |  | 770 | 770 |
| Inorganic filler 2b |  |  |  |  | 770 |  |  |  |  |
| Inorganic filler 3b |  |  |  |  |  | 770 |  |  |  |
| Inorganic filler 4b |  |  |  |  |  |  | 770 |  |  |
| Inorganic filler 10b | 100 | 100 |  | 100 | 100 | 100 | 100 | 100 | 100 |
| Coupling agent 1b | 3 | 3 | 3 | 3 | 3 | 3 | 3 |  |  |
| Coupling agent 2b |  |  |  |  |  |  |  | 3 |  |
| Coupling agent 3b |  |  |  |  |  |  |  |  | 3 |
| Carbon black | 3 | 3 | 3 | 3 | 3 | 3 | 3 | 3 | 3 |
| Carnauba wax | 5 | 5 | 5 | 5 | 5 | 5 | 5 | 5 | 5 |
| Spiral flow(cm) | 181 | 131 | 108 | 127 | 123 | 121 | 107 | 135 | 133 |
| Gold wire sweep(%) | 2 | 3 | 4 | 3 | 3 | 3 | 4 | 2 | 2 |
| Solder reflow resistance (Defect lot in ten lots) | 0 | 0 | 0 | 0 | 0 | 0 | 0 | 0 | 0 |

TABLE 2b

|  | Examples | | | | | | | |
| --- | --- | --- | --- | --- | --- | --- | --- | --- |
|  | 10b | 11b | 12b | 13b | 14b | 15b | 16b | 17b |
| Epoxy resin 2b | 41 | 90 | 116 | 72 | 72 | 72 | 72 | 72 |
| Phenol resin 2b | 25 | 56 | 70 | 44 | 44 | 44 | 44 | 44 |
| Curing Accelerator 2b | 3 | 3 | 3 | 3 | 3 | 3 | 3 | 3 |
| Inorganic filler 1b | 820 | 740 | 700 | 370 |  |  |  | 770 |
| Inorganic filler 6b |  |  |  |  | 100 |  |  |  |
| Inorganic filler 7b |  |  |  |  |  | 100 |  | 100 |
| Inorganic filler 8b |  |  |  |  |  |  | 100 |  |
| Inorganic filler 9b |  |  |  | 400 | 770 | 770 | 770 |  |
| Inorganic filler 10b | 100 | 100 | 100 | 100 |  |  |  |  |
| Coupling agent 1b | 3 | 3 | 3 | 3 | 3 | 3 | 3 | 3 |
| Carbon black | 3 | 3 | 3 | 3 | 3 | 3 | 3 | 3 |
| Carnauba wax | 5 | 5 | 5 | 5 | 5 | 5 | 5 | 5 |
| Spiral flow(cm) | 104 | 138 | 155 | 122 | 115 | 116 | 112 | 126 |
| Gold wire sweep(%) | 4 | 2 | 1 | 3 | 4 | 3 | 4 | 2 |
| Solder reflow resistance (Defect lot in ten lots) | 0 | 0 | 0 | 0 | 0 | 0 | 0 | 0 |

TABLE 3b

|  | Comparative Examples | | | | |
| --- | --- | --- | --- | --- | --- |
|  | 1b | 2b | 3b | 4b | 5b |
| Epoxy resin 2b | 72 | 72 | 72 | 72 | 72 |
| Phenol resin 2b | 44 | 44 | 44 | 44 | 44 |
| Curing Accelerator 2b | 3 | 3 | 3 | 3 | 3 |
| Inorganic filler 9b |  | 870 | 770 | 770 | 770 |
| Inorganic filler 10b |  |  | 100 | 100 | 100 |
| Inorganic filler 11b | 870 |  |  |  |  |
| Coupling agent 1b | 3 | 3 |  |  | 3 |
| Coupling agent 2b |  |  | 3 |  |  |
| Coupling agent 3b |  |  |  | 3 |  |
| Carbon black | 3 | 3 | 3 | 3 | 3 |
| Carnauba wax | 5 | 5 | 5 | 5 | 5 |
| Spiral flow(cm) | 26 | 81 | 111 | 113 | 108 |
| Gold wire sweep(%) | Failure | 7 | 4 | 4 | 4 |
| Solder reflow resistance (Defect lot in ten lots) | Failure | 3 | 2 | 2 | 3 |

(Result of Evaluation for Resin Composition of Second Embodiment)

As apparent from Tables 1b to 3b, the epoxy resin compositions in Examples according to the present invention exhibited the good values of spiral flow test which are indicators of the flowability, and exhibited the low values of the gold wire sweep test which are indicators of the flowability or the indicators of molding defect which may cause an electric failure of the package. Furthermore, no defect package was found among the samples, which means that the solder reflow resistance is good.

On the other hand, the epoxy resin compositions in Comparative Examples 1b and 2b containing no eutectic mixture of silicon dioxide and titanium oxide exhibited the values of spiral flow test lower than that of Examples by one figure. As for epoxy resin composition in Comparative Example 1b, the gold wire sweep and the solder reflow resistance could not be evaluated, because of low flowability. The epoxy resin composition in Comparative Example 2b exhibited the worse result of the solder reflow resistance than epoxy resin compositions in Examples. As for the epoxy resin compositions in Comparative Examples 3b, 4b and 5b, although the values of the spiral flow test and the values of the gold wire sweep test were within the allowable ranges, the evaluated values of the solder reflow resistance test were out of the allowable range.

Examples of Third Embodiment

The inorganic fillers (D) used in Examples and Comparative Examples according to the third embodiment are listed below.

A content ratio of alumina ($Al_2O_3$) in a silica filler or in a eutectic mixture of silicon dioxide ($SiO_2$) and alumina ($Al_2O_3$) was determined by measuring a solution of a sample dissolved in hydrofluoric acid with a high frequency plasma spectrometer ("ICPS1000 IV" available from Shimadzu Corporation), and then calculating the measured value.

(List of Inorganic Filler)

Inorganic filler 1c: a eutectic mixture of silicon dioxide and alumina which is a spherical inorganic filler obtained by adding alumina powder to silica material and then thermofusing them; average particle size=30.4 μm; specific surface=1.6 $m^2/g$; $SiO_2$=99.5 wt. %; $Al_2O_3$=0.5 wt. %.

Inorganic filler 2c: a eutectic mixture of silicon dioxide and alumina which is a spherical inorganic filler obtained by adding alumina powder to silica material and then thermofusing them; average particle size=26.2 μm; specific surface=1.9 $m^2/g$; $SiO_2$=95 wt. %; $Al_2O_3$=5 wt. %.

Inorganic filler 3c: a eutectic mixture of silicon dioxide and alumina which is a spherical inorganic filler obtained by adding aluimna powder to silica material and then thermofusing them; average particle size=26.4 μm; specific surface=2.8 $m^2/g$; $SiO_2$=82 wt. %; $Al_2O_3$=18 wt. %.

Inorganic filler 4c: a eutectic mixture of silicon dioxide and alumina which is a spherical inorganic filler obtained by mixing metallic silicon with metallic aluminum and then reacting them with oxygen; average particle size=0.6 μm; specific surface=6.6 $m^2/g$; $SiO_2$=99.0 wt. %; $Al_2O_3$=1.0 wt. %.

Inorganic filler 5c: a spherical fused silica; average particle size=28.8 μm; specific surface=1.5 $m^2/g$; $SiO_2$=99.9 Wt. %.

Inorganic filler 6c: a spherical silica which is a spherical inorganic filler obtained by reacting metallic silicon with oxygen; average particle size=0.6 μm; specific surface=6.2 $m^2/g$; $SiO_2$=99.9 wt. %.

Inorganic filler 7c: a crushed silica; average particle size=30.5 μm; specific surface=1.8 $m^2/g$; $SiO_2$=99.9 wt. %.

Example 1c

The following ingredients were mixed by means of a hot roll for 8 minutes at 95° C. Then, the mixture was cooled and then crushed, so that the epoxy resin composition was obtained. The obtained epoxy resin composition was evaluated in the same way as Example 1a. The result of evaluation is shown in Table 1c.

(Ingredients)

Epoxy resin 1c=68 wt. parts: biphenyl type epoxy resin "YX-4000" available from Japan Epoxy Resins Co., Ltd.; epoxy equivalent=190 g/eq; melting point=105° C.

Phenol resin 1c=48 wt. parts: phenol aralkyl resin having a phenylene skeleton "XLC-LL" available from Mitsui Chemicals, Inc.; hydroxy equivalent=165 g/eq; softening point=79° C.

Curing accelerator 1c=3 wt. parts: 1,8-diazabicyclo(5,4,0)undecene-7.

Inorganic filler 1c=770 wt. parts.

Inorganic filler 7c=100 wt. parts.

Coupling agent 1c=3 parts: γ-glycidoxypropyltrimethoxy silane.

Carbon black=3 wt. parts.

Carnauba wax=5 wt. parts.

Examples 2c to 14c and Comparative Examples 1c to 5c

Epoxy resin compositions were obtained almost in the same way as Example 1c, except that ingredients of each composition were varied as shown in Tables 1c to 3c. The obtained compositions were evaluated in the same way as Example 1c. The results were shown in Tables 1c to 3c.

Ingredients which were different from ingredients used in Example 1c are shown below.

(Ingredients different from Example 1c)

Epoxy resin 2c: phenol aralkyl type epoxy resin having biphenylene skeleton "NC3000P" available from NIPPON KAYAKU.CO.JP; softening point=58° C.; epoxy equivalent=273.

Phenol resin 2c: phenol aralkyl resin having biphenylene skeleton "MEH-7851SS" available from MEIWA PLASTIC INDUSTRIES, LTD.; softening point=107° C.; hydroxy equivalent=204.

Curing accelerator 2c: triphenyl phosphine-1,4-benzoquinone.

Coupling agent 2c: N-phenyl γ-aminopropyltriethoxy silane.

Coupling agent 3c: γ-mercaptopropyltrimethoxy silane.

TABLE 1c

| | Examples | | | | | | |
|---|---|---|---|---|---|---|---|
| | 1c | 2c | 3c | 4c | 5c | 6c | 7c |
| Epoxy resin 1c | 68 | | | | | | |
| Epoxy resin 2c | | 72 | 72 | 72 | 72 | 72 | 72 |
| Phenol resin 1c | 48 | | | | | | |
| Phenol resin 2c | | 44 | 44 | 44 | 44 | 44 | 44 |
| Curing accelerator 1c | | 3 | | | | | |
| Curing accelerator 2c | 3 | | 3 | 3 | 3 | 3 | 3 |
| Inorganic filler 1c | 770 | 770 | 870 | 770 | | | 770 |
| Inorganic filler 2c | | | | | 770 | | |
| Inorganic filler 3c | | | | | | 770 | |
| Inorganic filler 7c | 100 | 100 | | 100 | 100 | 100 | 100 |
| Coupling agent 1c | 3 | 3 | 3 | 3 | 3 | 3 | |
| Coupling agent 2c | | | | | | | 3 |
| Carbon black | 3 | 3 | 3 | 3 | 3 | 3 | 3 |
| Carnauba wax | 5 | 5 | 5 | 5 | 5 | 5 | 5 |
| Spiral flow(cm) | 187 | 102 | 103 | 121 | 116 | 113 | 131 |
| Gold wire sweep(%) | 2 | 4 | 4 | 3 | 3 | 4 | 2 |
| Solder reflow resistance (Defect lot in ten lots) | 0 | 0 | 0 | 0 | 0 | 0 | 0 |

TABLE 2c

| | Examples | | | | | | |
|---|---|---|---|---|---|---|---|
| | 8c | 9c | 10c | 11c | 12c | 13c | 14c |
| Epoxy resin 2c | 72 | 41 | 90 | 116 | 72 | 72 | 72 |
| Phenol resin 2c | 44 | 25 | 56 | 70 | 44 | 44 | 44 |
| Curing accelerator 2c | 3 | 3 | 3 | 3 | 3 | 3 | 3 |
| Inorganic filler 1c | 770 | 820 | 740 | 700 | 370 | | 770 |
| Inorganic filler 4c | | | | | | 100 | 100 |
| Inorganic filler 5c | | | | | 400 | 770 | |
| Inorganic filler 7c | 100 | 100 | 100 | 100 | 100 | | |
| Coupling agent 1c | | 3 | 3 | 3 | 3 | 3 | 3 |
| Coupling agent 3c | 3 | | | | | | |
| Carbon black | 3 | 3 | 3 | 3 | 3 | 3 | 3 |
| Carnauba wax | 5 | 5 | 5 | 5 | 5 | 5 | 5 |
| Spiral flow(cm) | 128 | 102 | 103 | 138 | 112 | 108 | 126 |
| Gold wire sweep(%) | 3 | 4 | 2 | 1 | 3 | 4 | 2 |
| Solder reflow resistance (Defect lot in ten lots) | 0 | 0 | 0 | 0 | 0 | 0 | 0 |

TABLE 3c

|  | Comparative Examples | | | | |
| --- | --- | --- | --- | --- | --- |
|  | 1c | 2c | 3c | 4c | 5c |
| Epoxy resin 2c | 72 | 72 | 72 | 72 | 72 |
| Phenol resin 2c | 44 | 44 | 44 | 44 | 44 |
| Curing accelerator 2c | 3 | 3 | 3 | 3 | 3 |
| Inorganic filler 5c |  | 870 | 770 | 770 | 770 |
| Inorganic filler 6c |  |  | 100 | 100 | 100 |
| Inorganic filler 7c | 870 |  |  |  |  |
| Coupling agent 1c | 3 | 3 |  |  | 3 |
| Coupling agent 2c |  |  | 3 |  |  |
| Coupling agent 3c |  |  |  | 3 |  |
| Carbon black | 3 | 3 | 3 | 3 | 3 |
| Carnauba wax | 5 | 5 | 5 | 5 | 5 |
| Spiral flow(cm) | 21 | 71 | 105 | 101 | 76 |
| Gold wire sweep(%) | Failure | 8 | 4 | 4 | 6 |
| Solder reflow resistance (Defect lot in ten lots) | Failure | 10 | 10 | 6 | 7 |

(Result of Evaluation for Resin Composition of Third Embodiment)

As apparent from Tables 1c to 3c, the epoxy resin compositions in Examples according to the present invention exhibited the good values of spiral flow test which are indicators of the flowability, and exhibited the low values of the gold wire sweep test which are indicators of the flowability or the indicators of molding defect which may cause an electric failure of the package. Furthermore, no defect package was found among the samples, which means that the solder reflow resistance is good.

On the other hand, the epoxy resin compositions in Comparative Examples 1c, 2c and 5c containing no eutectic mixture of silicon dioxide and alumina exhibited the values of spiral flow test lower than that of Examples by one figure. As for epoxy resin composition in Comparative Example 1c, the gold wire sweep and the solder reflow resistance could not be evaluated, because of low flowability. As for the epoxy resin compositions in Comparative Examples 2c and 5c, the evaluated values of the gold wire sweep test were out of the allowable range, and all or majority of samples had defects, which means the low solder reflow resistance. As for the epoxy resin compositions in Comparative Examples 3c and 4c, although the values of the spiral flow test and the values of the gold wire sweep test were within the allowable ranges, the evaluated values of the solder reflow resistance test were out of the allowable range.

INDUSTRIAL AVAILABILITY

According to the present invention including the first to third embodiments, there can be presented an epoxy resin composition for semiconductor encapsulating use with an excellent flowability and an excellent moldability which is suitable for a semiconductor device required a higher level solder reflow resistance.

The entire disclosure of Japanese Patent Application Nos. 2005-005863 filed on Jan. 13, 2005, 2005-066379 filed on Mar. 9, 2005 and 2005-096569 filed on Mar. 29, 2005 each including the specification, claims, drawings and summary is incorporated herein by reference in its entirety.

What is claimed is:

1. An epoxy resin composition for use in semiconductor encapsulating comprising: an epoxy resin (A); a phenol resin (B); a curing accelerator (C); and an inorganic filler (D), wherein
the inorganic filler (D) contains a eutectic mixture (d3) of silicon dioxide and alumina which is a spherical inorganic filler formed by: (a) adding aluminum powder to silica material and then thermofusing them; or (b) mixing metallic silicon with metallic aluminum and then reacting them with oxygen, wherein
a content ratio of the silicon dioxide in the eutectic mixture (d3) is not less than 80 weight percent and not more than 99.8 weight percent,
a content ratio of the alumina in the eutectic mixture (d3) is not less than 0.2 weight percent and not more than 20 weight percent, and
an extract of the eutectic mixture (d3) has a pH value no less than 3 and no more than 5.

2. The epoxy resin composition according to claim 1, wherein
a content ratio of the eutectic mixture (d3) is not less than 8 weight percent and not more than 93 weight percent relative to the epoxy resin composition as a whole.

3. The epoxy resin composition according to claim 1, wherein
a content ratio of the inorganic filler (D) containing the eutectic mixture (d3) is not less than 78 weight percent and not more than 93 weight percent relative to the epoxy resin composition as a whole.

4. A semiconductor device comprising a semiconductor element encapsulated with the epoxy resin composition according to claim 1.

* * * * *